(12) United States Patent
Kanazawa et al.

(10) Patent No.: US 7,096,406 B2
(45) Date of Patent: Aug. 22, 2006

(54) MEMORY CONTROLLER FOR MULTILEVEL CELL MEMORY

(75) Inventors: Keisuke Kanazawa, Kawasaki (JP);
Hiroaki Watanabe, Kawasaki (JP);
Yoshinobu Higuchi, Kawasaki (JP);
Hideki Arakawa, Kawasaki (JP);
Yoshiki Okumura, Kawasaki (JP);
Yutaka Sekino, Kawasaki (JP)

(73) Assignee: Spansion LLC, Sunnyvale, CA (US)

( * ) Notice: Subject to any disclaimer, the term of this patent is extended or adjusted under 35 U.S.C. 154(b) by 474 days.

(21) Appl. No.: 10/097,499

(22) Filed: Mar. 15, 2002

(65) Prior Publication Data

US 2003/0041299 A1 Feb. 27, 2003

(30) Foreign Application Priority Data

Aug. 23, 2001 (JP) .............................. 2001-252400

(51) Int. Cl.
*G11C 29/00* (2006.01)
*H03M 13/00* (2006.01)

(52) U.S. Cl. ...................... 714/763; 714/758; 714/775; 360/53; 365/200

(58) Field of Classification Search ................ 714/763, 714/773, 752, 758, 775; 360/53; 365/200
See application file for complete search history.

(56) References Cited

U.S. PATENT DOCUMENTS

| 5,640,349 | A | * | 6/1997 | Kakinuma et al. ...... 365/185.33 |
| 5,724,285 | A | * | 3/1998 | Shinohara .............. 365/185.25 |
| 5,754,566 | A | | 5/1998 | Christopherson et al. ... 714/773 |
| 5,859,858 | A | * | 1/1999 | Leeman ...................... 714/721 |
| 6,076,182 | A | | 6/2000 | Jeddeloh ...................... 714/763 |
| 6,601,211 | B1 | * | 7/2003 | Norman ....................... 714/773 |
| 6,891,759 | B1 | * | 5/2005 | Katayama et al. ...... 365/185.24 |

FOREIGN PATENT DOCUMENTS

| EP | 0 858 076 A2 | 8/1998 |
| EP | 0 940 752 A1 | 9/1999 |
| JP | A-11-250695 | 9/1999 |

* cited by examiner

*Primary Examiner*—Albert Decady
*Assistant Examiner*—Esaw Abraham
(74) *Attorney, Agent, or Firm*—Arent Fox PLLC

(57) ABSTRACT

A N-level cell memory controlled by the memory controller of the invention have an internal configuration in which the plurality of data input/output terminals connected to the second data bus are separated into first through Mth data input/output terminal groups, such that there is no redundancy in the n bits of data associated with one N-level cell. Together with this, the memory controller separates the plurality of data bits on the first data bus into first through Mth data groups, the ECC circuits generate error-correction codes for each of these data groups, and the first through Mth data groups and first through Mth error correction codes are input to the first through Mth data input/output terminals of the N-level cell memory, via the second data bus.

19 Claims, 16 Drawing Sheets

FIG. 16

ECC (lp,cp) CALCULATION

PAIR
- lp00 = PARITY OF ALL BITS OF [xxxxxx0,xxxx]
- lp01 = PARITY OF ALL BITS OF [xxxxxx1,xxxx]

PAIR
- lp02 = PARITY OF ALL BITS OF [xxxxx0x,xxxx]
- lp03 = PARITY OF ALL BITS OF [xxxxx1x,xxxx]

PAIR
- lp04 = PARITY OF ALL BITS OF [xxxx0xx,xxxx]
- lp05 = PARITY OF ALL BITS OF [xxxx1xx,xxxx]

PAIR
- lp06 = PARITY OF ALL BITS OF [xxx0xxx,xxxx]
- lp07 = PARITY OF ALL BITS OF [xxx1xxx,xxxx]

PAIR
- lp08 = PARITY OF ALL BITS OF [xx0xxxx,xxxx]
- lp09 = PARITY OF ALL BITS OF [xx1xxxx,xxxx]

PAIR
- lp10 = PARITY OF ALL BITS OF [x0xxxxx,xxxx]
- lp11 = PARITY OF ALL BITS OF [x1xxxxx,xxxx]

PAIR
- lp12 = PARITY OF ALL BITS OF [0xxxxxx,xxxx]
- lp13 = PARITY OF ALL BITS OF [1xxxxxx,xxxx]

PAIR
- cp00 = PARITY OF ALL BITS OF [xxxxxxx,xxx0]
- cp01 = PARITY OF ALL BITS OF [xxxxxxx,xxx1]

PAIR
- cp02 = PARITY OF ALL BITS OF [xxxxxxx,xx0x]
- cp03 = PARITY OF ALL BITS OF [xxxxxxx,xx1x]

PAIR
- cp04 = PARITY OF ALL BITS OF [xxxxxxx,x0xx]
- cp05 = PARITY OF ALL BITS OF [xxxxxxx,x1xx]

PAIR
- cp06 = PARITY OF ALL BITS OF [xxxxxxx,0xxx]
- cp07 = PARITY OF ALL BITS OF [xxxxxxx,1xxx]

x MEANS "DON'T CARE", EITHER 1 OR 0

ECC CIRCUIT IN MEMORY CONTROLLER

MEMORY CONTROLLER FOR MULTILEVEL CELL MEMORY

BACKGROUND OF THE INVENTION

1. Field of the Invention

This invention relates to a memory controller for a multilevel cell memory, and in particular to a memory controller having an ECC circuit which generates error detection/correction codes and performs an error detection and correction for multilevel cells.

2. Description of the Related Art

Flash memory is coming into widespread use primarily in portable data terminals, portable telephone sets, and other portable information equipment. Flash memory is nonvolatile semiconductor memory, which can retain stored data even if the power supply is turned off, and so is widely adopted mainly in battery-driven portable information equipment.

Trends toward greater functionality and broadband communications in recent years have been accompanied by mounting demand for flash memory with greater storage capacity. In order to satisfy such demands, multilevel-cell flash memory has been proposed. Broadly defined, this multilevel-cell memory is memory in which cells store states with three or more values; normally, in this memory cells store $2^n$ states (where n is an integer greater than or equal to 2). Hence if there are four charge states, two bits of data are stored in a single cell; if there are eight charge states, three bits of data are stored in a single cell; and if there are $2^n$ charge states, then n bits of data are stored in a single cell.

Semiconductor memory such as flash memory has a high per-bit cost, and therefore the use of ECC code, which requires numerous bits, is not suited to flash memory. On the other hand, flash memory is more reliable than hard disks or other storage media, with a defect occurring in at most one cell. Hence many conventional one-bit-cell memory devices adopt as the ECC code a Hamming code, for which correction of up to one-bit errors is possible. This is because, for an ECC code capable of correction of errors in a plurality of bits, the number of bits required to the ECC becomes too great, and there is no need for correction of errors in a plurality of bits. That is, when, as in the case of flash memory, the per-bit cost is high, but reliability is high enough that a defect occurs in at most one bit, a Hamming code enabling correction of up to one bit error using a small number of bits is appropriate as the ECC code.

If a defect occurs in a certain cell of a multilevel cell memory supporting large storage capacity, the n bits of data associated with the defective cell may simultaneously become defective bits. Consequently an error correction code using the above Hamming code capable of correction of up to one-bit errors cannot correct the errors in n bits (where n is two or greater) accompanying a single defective cell, and so a different type of ECC code other than the Hamming code, with a greater number of bits, must be used. For example, a complex ECC code adopted in hard disks might be used. However, such ECC codes with a large number of bits are not suited to flash memory with its high per-bit cost.

In order to address the above problem, it has been proposed, in U.S. Pat. No. 5,754,566, that an ECC circuit be provided in a memory device, that this ECC circuit be designed to separate serial data into a plurality of data words, so that within a data word there is only one bit associated with the n bits of one cell, and that an ECC code be generated for each data word, and stored in an n-bit cell.

However, incorporation of an ECC circuit in a memory device will tend to increase the cost of the memory device, and so is undesirable. Particularly in a system in which are installed a plurality of memory devices, the same ECC circuit is provided redundantly in a plurality of memory devices, driving up the cost of the overall system.

SUMMARY OF THE INVENTION

An object of the present invention is to provide a memory controller which incorporates an ECC circuit for a multi-bit cell memory.

A further object of this invention is to provide a memory controller which, for a multi level cell memory, generates an ECC code capable of error correction using a small number of bits, and performs error correction.

In order to achieve the above objects, a first aspect of this invention is a memory controller for a multilevel cell memory, connected between a host and an N-level cell memory (where $N=2^n$, and n is an integer greater than or equal to 2) via data buses the widths of each of which are a plurality of bits, comprising: first through Mth ECC circuits (where M is equal to n or greater), which input in parallel first through Mth data groups of a first data bus connected to the host, and generates first through Mth error correction codes capable of correction single-bit defect, for the first through Mth data groups; and data output unit which outputs the data groups to a second data bus connected to the data input/output terminals of the above N-level cell memory, such that the n-bit data associated with a single N-level cell are separated into the first through Mth data groups without overlap; and wherein the data output unit further outputs to the second data bus the error correction codes generated by the above ECC circuits.

Of the plurality of bits of data input via the second data bus, the N-level cell memory connected to the above memory controller for multilevel cell memories combines at most single bit of data from each of the first through Mth data groups, and stores these combined data bits in a single N-level cell. It is preferable that at most the single bit of data from each of the error correction codes generated by the first through Mth ECC circuits also be combined and stored in a single N-level cell.

The N-level cell memory controlled by the memory controller of the above invention have an internal configuration in which the plurality of data input/output terminals connected to the second data bus are separated into first through Mth data input/output terminal groups, such that there is no redundancy in the n bits of data associated with one N-level cell. Together with this, the memory controller separates the plurality of data bits on the first data bus into first through Mth data groups, the ECC circuits generate error-correction codes for each of these data groups, and the first through Mth data groups and first through Mth error correction codes are input to the first through Mth data input/output terminals of the N-level cell memory, via the second data bus.

As a result, the n bits of data associated with each N-level cell are separated into a plurality of ECC zones without overlap, and error-correction codes are generated and stored for the data of each of the ECC zones. Hence even if a defect occurs in one N-level cell, and n bits of data become defective simultaneously, the error-correction codes generated for each ECC zone can be used to perform correction of the n bits of data. That is, n defective bits can be corrected even when using an error correction code capable of correction of a single defective bit.

When the data input/output terminals of an N-level cell memory device are separated into, in order from the lowest, first, second, . . . , Mth data groups, the data output unit of the memory controller outputs data to the second data bus so as to be allocated, in order from the lowest, to the first, second, . . . , Mth data groups. Together with this, the data of the first data bus can also be divided, in order from the lowest, into first, second, . . . , Mth data groups, and input to the first through Mth ECC circuits, so that the configuration for division into data groups within the memory controller is comparatively simple.

When the data input/output terminals of an N-level cell memory device are divided into data groups associated with N-level cells in order from the lowest, the memory controller data output unit outputs data to the second data bus such that data for the first, second, . . . , Mth data groups, in order from the lowest, is repeated cyclically. That is, the data output unit combines data from the first through Mth data groups for output to the second data bus, such that the n bits of data associated with one N-level cell are divided into the first through Mth data groups, without overlap.

In the above invention, when reading data from N-level cell memory, the first through Mth data groups and the first through Mth error correction codes of the second data bus, are provided to the respective first through Mth ECC circuits within the memory controller, and the first through Mth ECC circuits perform one-bit error correction within the first through Mth data groups.

Hence between the host and the N-level cell memory, writing is performed via the first data bus, first through Mth ECC circuits, data output unit, and second data bus; and reading is performed via the same route, but in the opposite order.

Write data is supplied to the ECC circuits and is provided to the memory in synchronization with the clock; in addition, read data is output from the memory and supplied to the ECC circuits in synchronization with the clock. Hence the effect on clock synchronization operation between the host and the memory device can be minimized, and error correction code generation and error correction can be performed.

In order to attain the above objects, a second aspect of this invention is a memory controller for a multilevel cell memory, connected between a host and an N-level cell memory (where $N=2^n$, and n is an integer greater than or equal to 2) via data buses the widths of each of which are a plurality of bits, comprising: a common ECC circuit which inputs in order first through Mth (where M is greater than or equal to n) data groups, separated in the address direction, for the data groups of the first data bus, connected to the host, and generates first through Mth error correction codes capable of correction of single-bit defect for the first through Mth data groups; error correction code holding unit to hold the first through the (M−1)th error correction codes; and data output unit to output the data to the second data bus, connected to the above N-level cell memory, such that the n bits of data associated with a single N-level cell are separated into the first through Mth data groups without overlap; and wherein the data output unit outputs to the second data bus the first through (M−1)th error correction codes held by the error correction code holding unit and the Mth error correction code generated by the above ECC circuit.

In order to attain the above objects, a third aspect of this invention is a memory controller for a multilevel cell memory, connected between a host and an N-level cell memory (where $N=2^n$, and n is an integer greater than or equal to 2) via data buses the widths of each of which are a plurality of bits, comprising: having first through Mth ECC circuits (where M is greater than or equal to n), which input first through Mth data groups, separated in the address direction, for the data group of the first data bus connected to the host, and for the first through Mth data groups, generate first through Mth error correction codes capable of correcting single-bit defects; data output unit which outputs data to the second data bus connected to the above N-level cell memory, such that the n bits of data associated with one N-level cell are separated into the first through Mth data groups without overlap; and wherein the data output unit outputs to the second data bus the error correction codes generated by the ECC circuits.

In a more preferred embodiment, in the above first, second and third aspects of the invention, the memory device performs reading and writing of the plurality of data bits of the above data buses in page units each of which includes a plurality sets of plural bits data of the data bus, and the plurality of bits of data of the data bus are written to and read from an internal page buffer in internal address order. Further, the data within the page is separated into first through Mth data groups by (1) data input/output terminals (columns), or by (2) internal addresses (rows); error correction codes capable of single-bit error correction are generated by an ECC circuit for each data group, and correction is performed. Hence the ECC circuits and data output unit of the memory controller have a configuration compatible with the above separation method.

In the above-described invention, the ECC generation circuits generate ECC codes based on an error correction code method capable of correction of single-bit defect for the data in each ECC zone. Hence the number of bits of the generated ECC code is held to a minimum, and can be stored in the spare area of flash memory. Thus only one of the bits of the n bits of data associated with a single N-level cell is associated with each ECC zone, so that even if defects occur in n bits due to occurrence of a defect in a single multilevel cell, correction of n error bits is possible, by performing single-bit error correction in each ECC zone.

BRIEF DESCRIPTION OF THE DRAWINGS

FIG. 16 is a figure showing an example of ECC codes generated for each zone;

DESCRIPTION OF THE PREFERRED EMBODIMENTS

Figure 1:
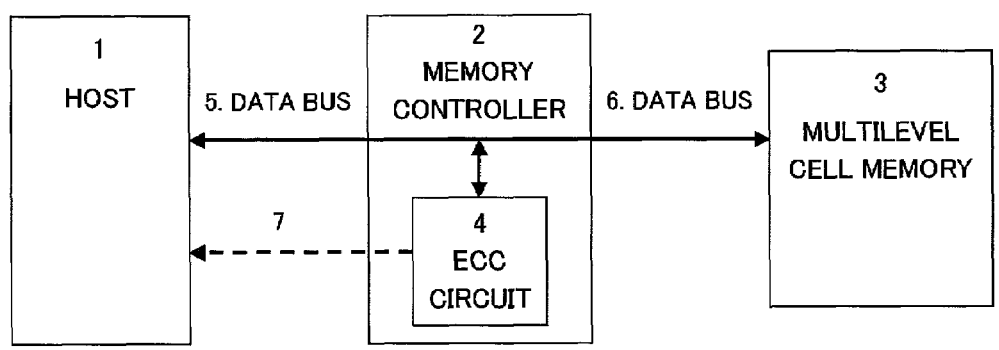
FIG. 1 is a view of the configuration of a memory system using a multilevel cell memory.

Below, aspects of embodiments are explained, referring to the drawings. However, the scope of protection of this patent is not limited to the following aspects, but extends to the invention as described in the scope of claims, and the equivalent thereof.

FIG. 1 is a view of the configuration of a memory system using a multilevel cell memory. Here a multilevel cell memory is memory capable of holding n bits (where n is an integer greater than or equal to 2) within a single cell; hence a single cell has $N=2^n$ states. In this example, the host 1 and the multilevel cell memory 3 are connected by data buses 5, 6, between which a memory controller 2 is provided. Specifically, a first data bus 5 is provided between the host 1 and memory controller 2, and a second data bus 6 is provided between the memory controller 2 and the multilevel cell memory 3. The memory controller 2 generates error correction codes (hereafter "ECC codes") for data supplied by the data buses 5, 6, and incorporates an ECC circuit 4 which performs error correction.

The host 1 reads data from, and writes data to, the multilevel cell memory 3. Here the memory controller 2 intermediates to enable the host 1 to access the multilevel cell memory 3. When the host 1 writes data to the multilevel cell memory 3, the ECC circuit generates an ECC code for this data, and writes the ECC code, together with the data, to the multilevel cell memory 3. Normally, this ECC code is written to spare area, which is a redundant cell area of the multilevel cell memory 3. And when the host 1 reads data from the multilevel cell memory 3, the ECC circuit 4 generates an ECC code for the read data, and by comparing the generated ECC code with the read-out ECC code, detects data errors and corrects these errors.

In the memory system example of FIG. 1, when the ECC circuit 4 detects a data error, the host is notified of the error occurrence by the error detection means 7, and error correction information (the error occurrence address and similar) is transmitted to the host 1 via the data bus 5. The host 1 then corrects the readout data error according to the error correction information. In another memory system example, the ECC circuit 4 incorporates a data buffer which holds, for example, one page worth of data; errors are corrected within the ECC circuit, and the corrected data is transmitted to the host 1 via the data bus 5. The memory controller of this aspect of the embodiment may have either of these configurations.

Figure 2:
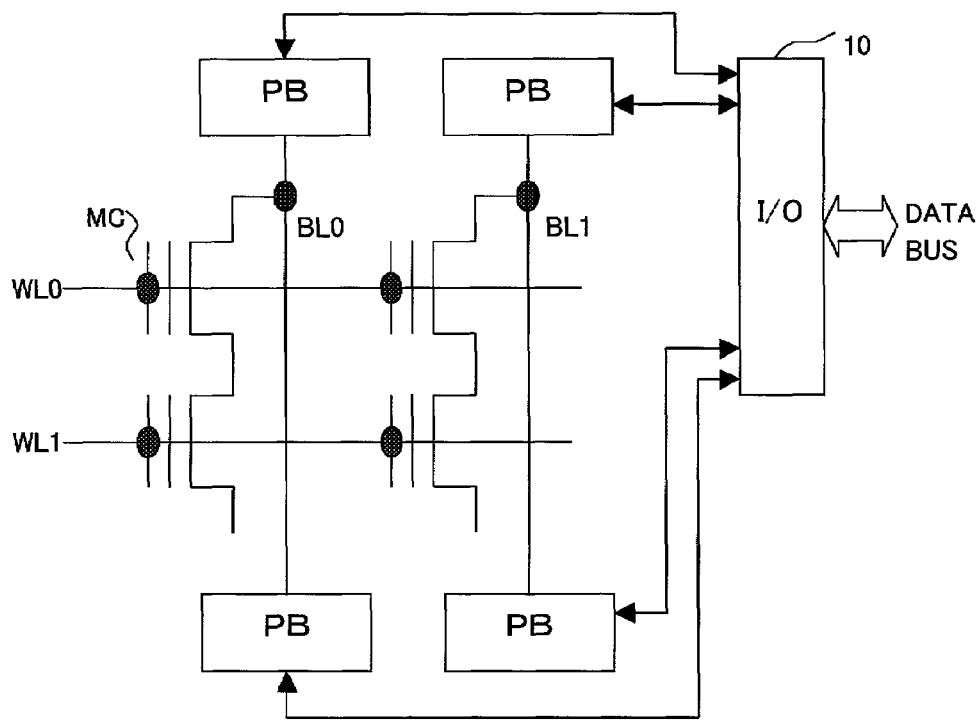
FIG. 2 is a circuit diagram showing an example of the configuration of a multilevel cell memory.

FIG. 2 is a circuit diagram showing an example of the configuration of a multilevel cell memory. This is an example of NAND-type flash memory. For simplicity, an example in which two bits of data are held in one cell is explained. In the multilevel cell memory of FIG. 2, cell strings in which a plurality of cells MC are connected in a column are connected to the bit lines BL0, BL1, and word lines WL0, WL1 are connected to the control gate for each cell. Each cell MC has, for example, a floating gate, and four charge states are stored in the floating gate. Hence each cell MC stores two bits of data.

Accompanying this, two page buffers PB are connected to each of the bit lines BL0, BL1, and when one cell MC is accessed, data is read one bit at a time to the two page buffers PB; in the other hand, the charge state of a single cell MC is stored according to the two bits of data input to the page buffers PB respectively.

During readout, by selecting a word line, the data is read out to all page buffers PB, and one page of data is held. Data within the page buffer PB is output from the input/output circuit 10 in units of the number of bits of the data bus, in response to a select signal, not shown. During writing, on the other hand, data is supplied from the data bus in units of the number of bits of the data bus, and is stored in the page buffers in response to a select signal, not shown; then cells MC are programmed to a charge state corresponding to the data.

Figure 3:
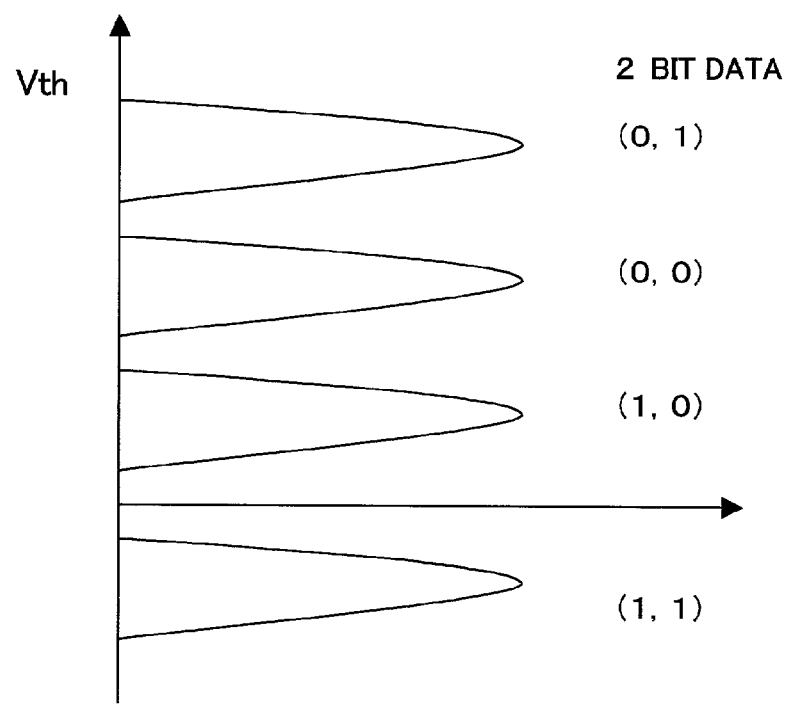
FIG. 3 is a figure showing cell charge states.

FIG. 3 is a figure showing cell charge states. The vertical axis indicates the cell threshold voltage; the horizontal axis indicates the number of cells. That is, the distribution of the plurality of threshold voltages of a cell is shown. As shown in the figure, the charge states within the cell floating gate include the state of (0,1) data for which there is an extremely large amount of charge (electrons), and the threshold voltage is highest; the state of (0,0) data with the next-largest amount of charge and the next-highest threshold voltage; the state of (1,0) data with the next-largest amount of charge and the next-highest threshold voltage; and then the state of data (1,1). If the potential of the word line is set at a level between the threshold distributions, differences occur in the drain current of the cell transistor according to the state, and it is possible to detect the distribution charge state.

Figure 4:
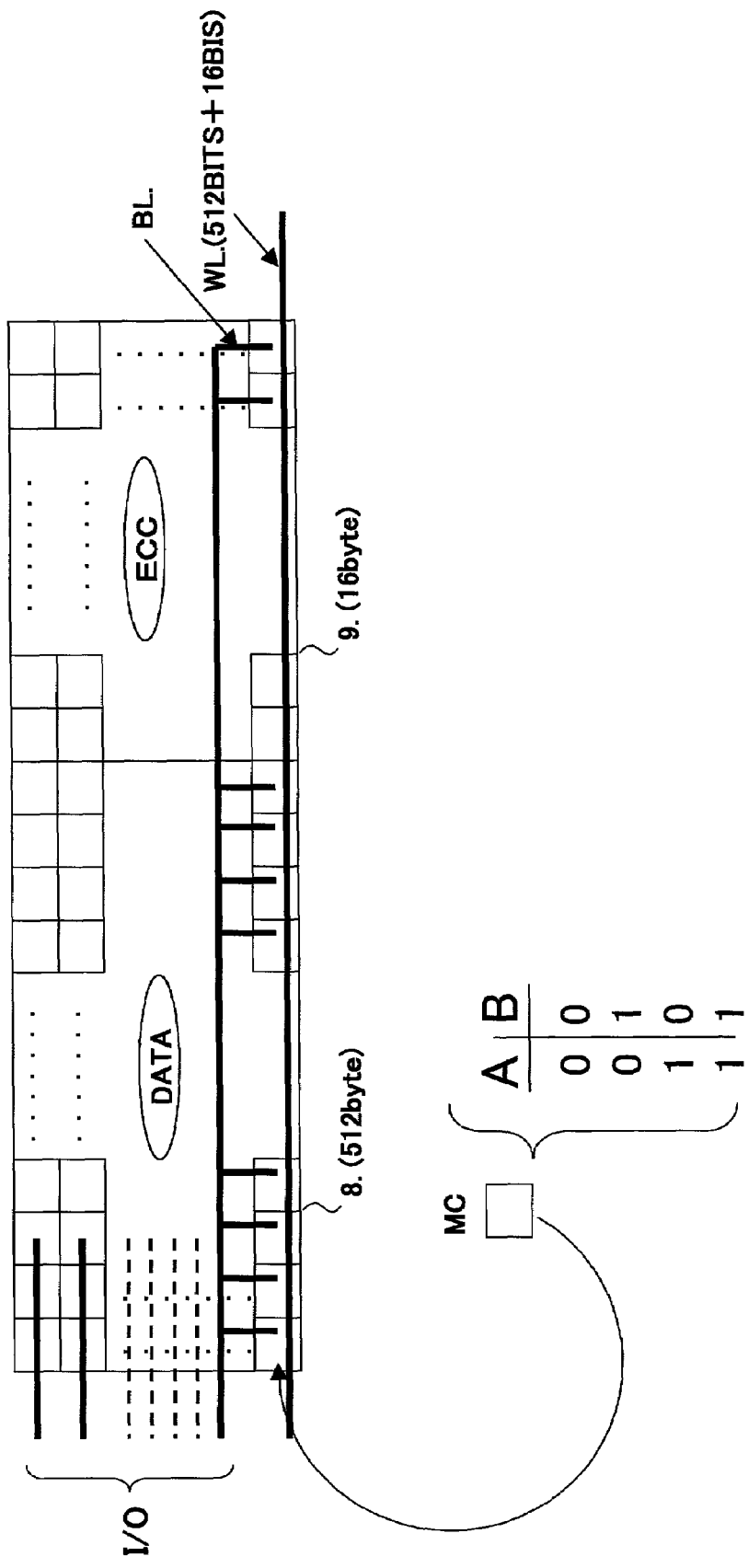
FIG. 4 is a view of the configuration of a multilevel cell memory device.

FIG. 4 is a view of the configuration of a multilevel cell memory device. In FIG. 4, the cell array for a single page is shown; the cell array has a data area 8 for storage of data, and a spare area 9 having redundant cells for replacing ing of defective cells. ECC codes generated for the write data are written to this spare area 9. As shown in FIG. 4, four charge states can be stored in each cell MC, and consequently two bits of data A, B can be stored.

In the example of FIG. 4, in one page, the data area 8 has a capacity of 512 bytes, and the spare area 9 has a capacity of 16 bytes. That is, the data capacity of one page is 512 bytes, and the corresponding spare area 9 has a capacity of 16 bytes. When one word line WL is selected, 512 bits of data from the data area 8, and 16 bits of data from the spare area 9, for a total of 528 bits, are read to the page buffer, not shown. By simultaneous selection of eight word lines, 512 bytes of data are read from the data area 8, and 16 bytes of data are read from the spare area 9 into the page buffer. Then, data is output 8 bits (one byte) at a time to eight I/O terminals, in synchronization with address increments.

Figure 5:
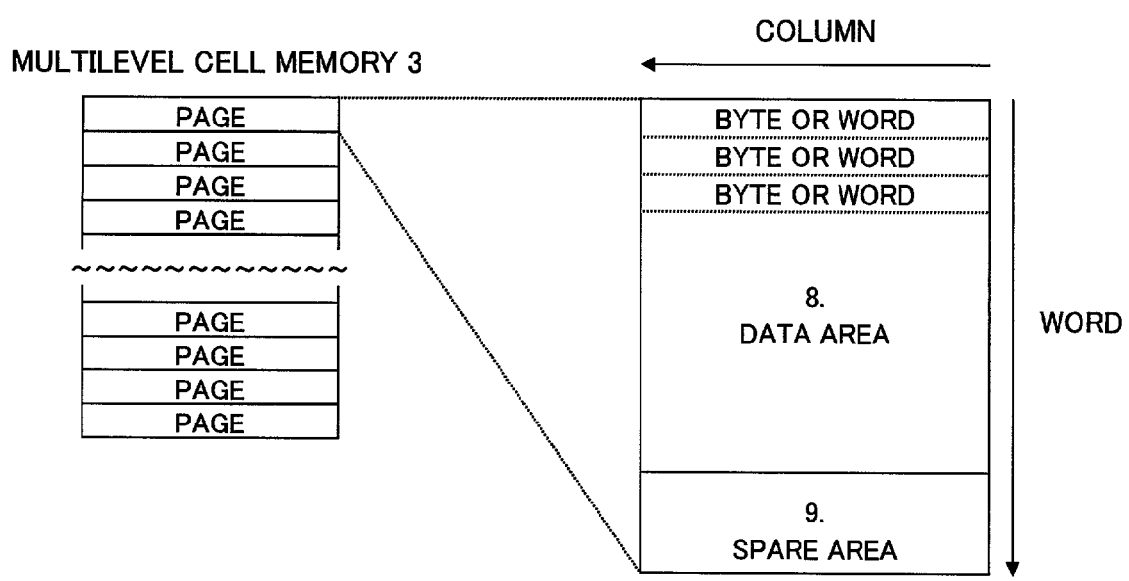
FIG. 5 is a figure showing the page configuration of multilevel cell memory.

FIG. 5 is a figure showing the page configuration of multilevel cell memory. Flash memory normally performs readout and write operations in page units. Hence the cell area has a plurality of pages. As shown in FIG. 4, each page has a 512-byte data area 8 and a 16-byte spare area 9. In the example of FIG. 4, there are eight input/output terminals I/O. In the case of 16 input/output terminals I/O, each page consists of a 512-word data area 8 and a 16-word spare area 9.

The flash memory is only instructed to perform reading or writing of a certain page by the memory controller. Hence in the specified page, the flash memory increments (or decrements) the address in synchronization with the clock in the memory, and performs address management within the page. That is, when there is a request to access a particular page, the flash memory first accesses the 512 bytes of data in the data area 8 while incrementing the address in the page, and then accesses the 16 bytes of data in the spare area 9.

In an N-level cell memory (where N is 4 or greater), a single cell stores n bits of data ($2^n$=N). Specifically, n bits of data are stored by holding the $2^n$ states shown in FIG. 3 in a single cell. Hence when a single defective cell occurs within one page, errors occur simultaneously for n bits of data. In order to enable recovery from such data errors in a plurality of bits by using an error correction code capable of correcting single-bit defects, in this aspect, a single page of data is divided into a plurality of data groups, and error correction codes capable of correction of single-bit defects are generated for each data group and are stored in the spare area in the memory device. The n bits of data associated with a single multilevel cell are then divided into a plurality of data groups without overlap, and correction of at most one error bit is possible for each of the divided data groups. By this means, even if a single cell defect occurs, there is at most only one error bit in each of the data groups, so that even a simple error correction code capable of correcting only single-bit defects can be used for error correction of the defect of a multilevel cell.

As described above, the data of one page can be separated into the direction of input/output terminal (column direction) corresponding to the plurality of bits of the data bus, and the direction of address (row direction) assigned to the plurality of bits of the data bus. The data of one page is accessed in word units while incrementing the address, so that if the data is divided in the input/output terminal direction (column direction), the plurality of data bits of the data bus are divided into a plurality of data groups within the data bus, and if divided in the address direction (row direction), the plurality of data bits of the data bus are divided into a plurality of data groups within a plurality of addresses.

Figure 6:
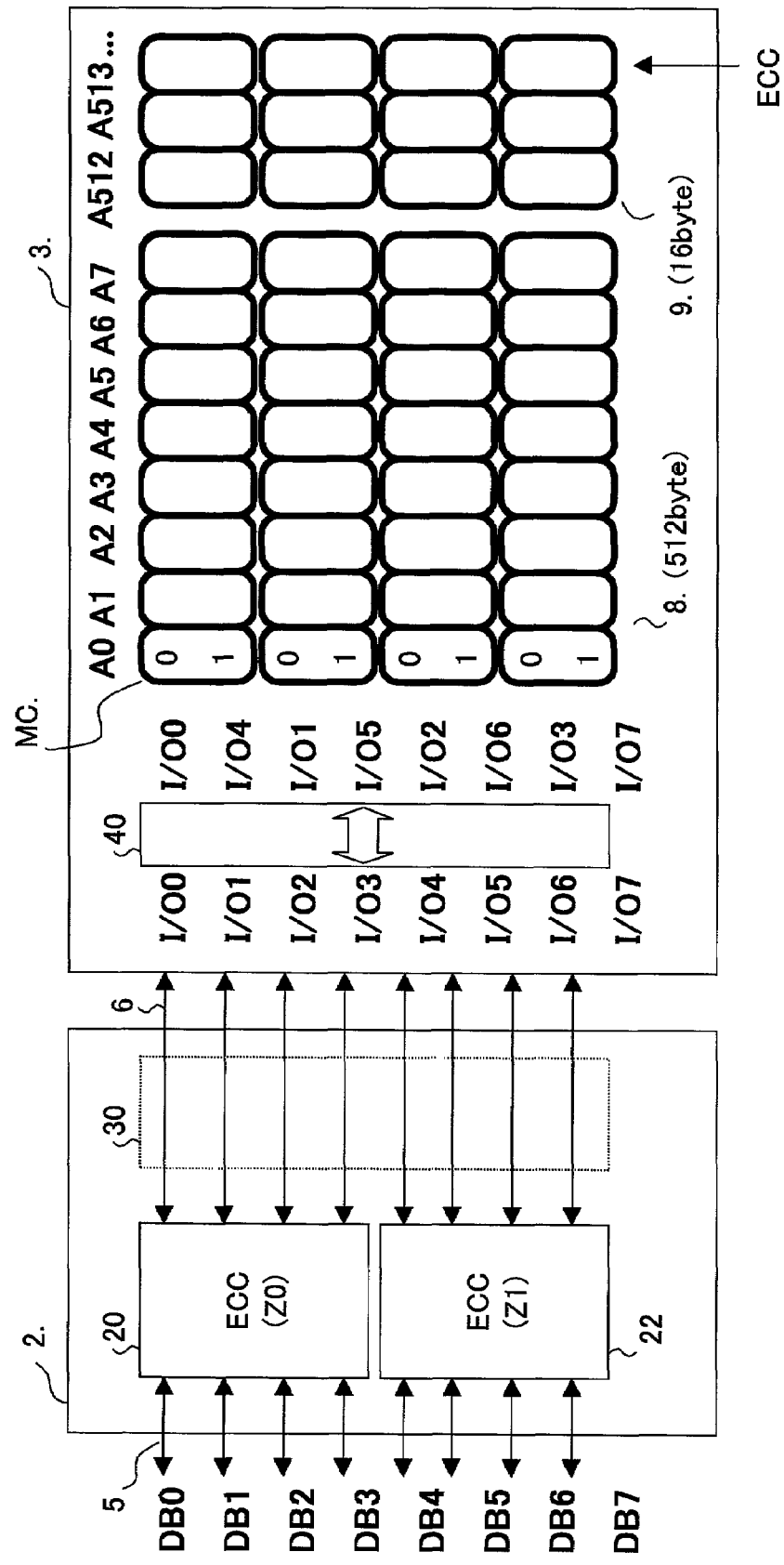
FIG. 6 is a figure showing an example of the configuration of a memory device and memory controller, for the case in which page data is separated in input/output terminal (column) units into a plurality of ECC zones.

FIG. 6 is a figure showing an example of the configuration of a memory device and memory controller, for the case in which page data is separated in input/output terminal (column) units into a plurality of ECC zones. In this example, the memory device 3 is an example in which two bits of data are held in one cell MC, in a configuration enabling access of the eight bits of data in four cells at the same address Ai. Each of the two bits of data of each cell are separated into the lower input/output terminal groups I/O0 to I/O3 and the upper input/output terminal groups I/O4 to I/O7, without overlap. That is, the two bits of data of the cell MC shown in the figure are allocated, one to the input/output terminal I/O0, the other to the input/output terminal I/O4. The two bits of data of the other cells are also allocated to I/O1 and I/O5, I/O2 and I/O6, and I/O3 and I/O7, respectively. The four pairs of two data bits I/O0, 4, I/O1, 5, I/O2, 6, I/O3, 7 are connected to the eight input/output terminals I/O0 to I/O7 via the input/output wiring structure 40 in the memory device 3, and the input/output terminals are connected to the second data bus 6.

In the case of the configuration of the above memory device 3, it is necessary that the 512 bytes and 16 bytes of the data area 8 and the spare area 9 be separated into at least two ECC zones in the input/output terminal (column) direction, and that ECC codes be generated for each. Even if one cell MC is defective and two data bits are error bits, the two data bits are separated into different ECC zones, for which separate ECC codes are generated; so that even if the ECC code is a code capable of correcting only a single bit, two ECC codes can be used to correct two data bits of one cell MC.

Together with this memory device structure, in the memory controller 2 of this aspect, the 8 bits of the first data bus 5 are separated into the four lower bits DB0 to 3 and the four upper bits DB4 to 7, and the respective data groups DB0 to 3 and DB4 to 7 are supplied to the ECC circuits 20, 22 of zones 0 and 1. In the ECC circuits 20, 22, ECC codes are generated for the respective supplied data groups DB0 to 3 and DB4 to 7, and in addition the supplied data groups DB0 to 3 and DB4 to 7 are output without modification at the data output circuit 30 to the eight bus lines of the second data bus 6, and supplied to the eight input/output terminals I/O0 to 7 of the memory device 3.

In the memory device 3, one bit from the first data group I/O0 to 3 and one bit from the second data group I/O4 to 7 are combined by the input/output wiring structure 40, and four pairs of two data bits I/O0, 4, I/O1, 5, I/O2, 6, I/O3, 7, are written to four two-bit cells MC respectively.

When 512 bytes of data are written to the data area 8 of the memory device 3, the ECC circuits 20, 22 complete generation of the respective ECC codes, and the generated first and second ECC codes are supplied to the input/output terminals I/O0 to 3 and I/O4 to 7 of the memory device, via the lower bits and upper bits of the second data bus 6. Within the memory device, two data bits are written to cells of the spare area 9, similarly to the data area 8.

On the other hand, during a read operation in the memory device 3, the 512 bytes and 16 bytes of data are read to a page buffer, not shown, and data held in the page buffer is output eight bits at a time to the input/output terminals I/O0 to 7 by incrementing the address. The ECC circuits 20, 22 within the memory controller generate ECC codes on input of the first and second data groups, and then compare the generated ECC codes with the first and second ECC codes read from the spare area 9, and perform error detection and error correction.

The data of the read-out first and second data groups is transferred to the host 1 via the first data bus 5, and error correction data is supplied to the host 1 via error notification means 7, not shown.

In the example of FIG. 6, the two data bits associated with one two-level cell are separated into first and second data groups without overlap by the input/output wiring structure 40 in the memory device, and the first and second data groups are allocated to the lower input/output terminal group I/O0 to 3 and to the upper input/output terminal group I/O4 to 7, respectively. Hence in the memory controller 2, the first and second ECC circuits 20, 22 generate the ECC codes for the input lower data group DB0 to 3 and the upper data group DB4 to 7 in the first data bus 5, and the data output means 30 outputs the first and second data groups, and the first and second ECC codes, to the lower data group and upper data group of the second data bus 6.

Figure 7:
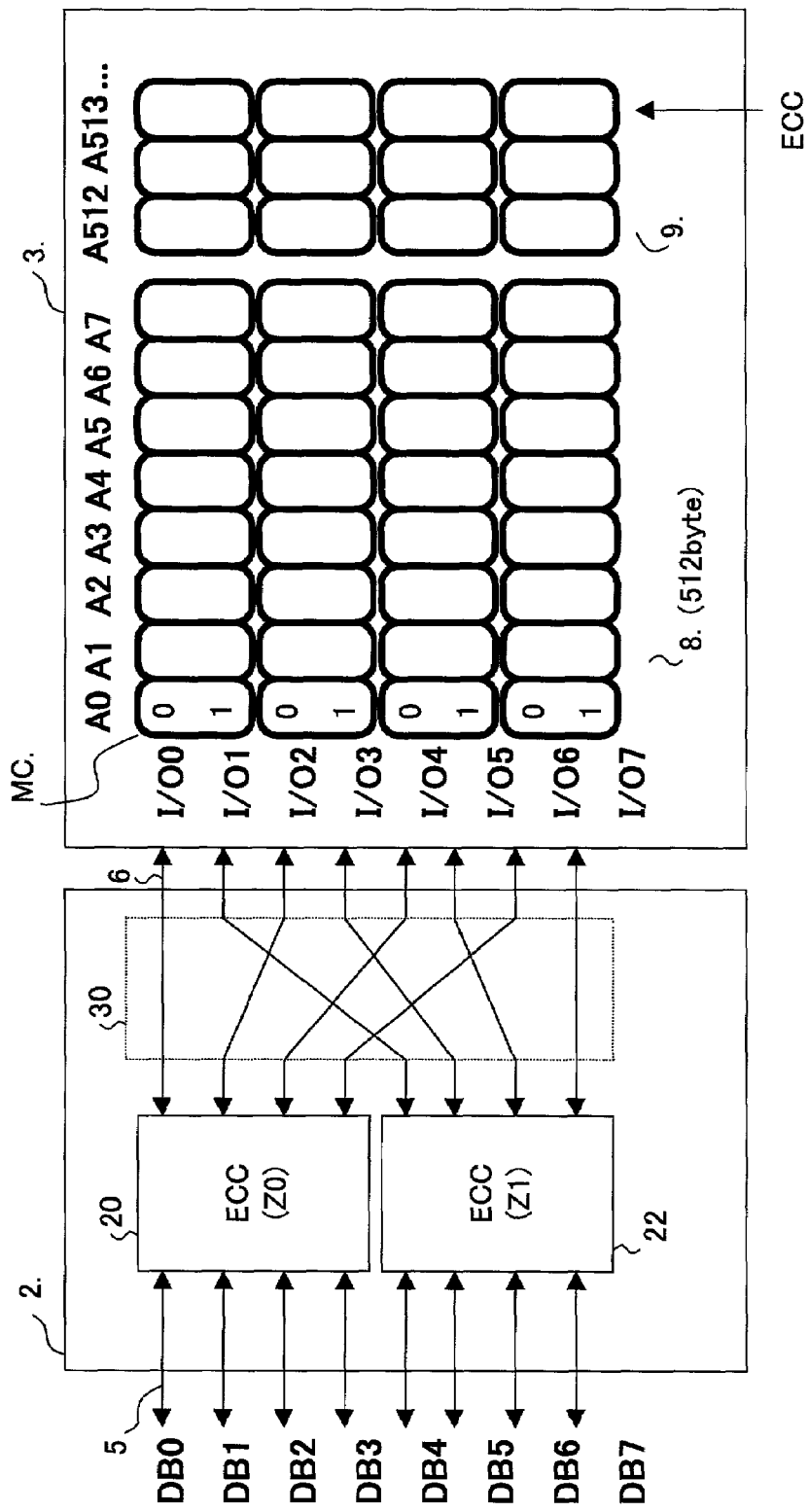
FIG. 7 is a figure showing another example of the configuration of a memory device and memory controller, for the case in which page data is separated in input/output terminal (column) units into a plurality of ECC zones.

FIG. 7 is a figure showing another example of the configuration of a memory device and memory controller, for the case in which page data is separated in input/output terminal (column) units into a plurality of ECC zones. In this memory device, there is no input/output wiring structure 40 as in FIG. 6, and the input/output terminals are allocated two data bits per cell from the lowest data group, without modification. Otherwise the data area 8 and spare area 9 are the same as in FIG. 6. Hence in this case also, it is necessary to divide data into first and second data groups in the input/output terminal (column) direction.

There is no input/output wiring structure 40 in the memory device 3, and so in the data output means 30 of the memory controller 2, the lower or first data group DB0 to 3 and the upper or second data group DB4 to 7 in the first data bus 5 are interleaved, and one data bit each from the first and second data groups is output to the second data bus 6, arranged in alternation. That is, the data output means 30 is provided with the function of the input/output wiring structure 40 of FIG. 6. As a result, two data bits consisting of one data bit each from the first and second data groups are written to each two-bits cell MC. Moreover, the first and second error correction codes (ECC codes) generated by the two ECC circuits are similarly written to two-bit cells in the spare area 9.

Otherwise, the configuration of the memory controller 2 is the same as the example of FIG. 6. Hence the plurality of data bits of the first data bus 5 are separated into first and second ECC zones, and the ECC circuits 20, 22 generate ECC codes for the data of the respective ECC zones. The data output means 30 of the memory controller 2 then supplies the data DB0, DB4, DB1, DB5, DB2, DB6, DB3, DB7 to the input/output terminals I/O0 to 7 of the memory device 3. As a result, four pairs of data, DB0 and DB4, DB1 and DB5, DB2 and DB6, and DB3 and DB7, are written to four two-bit cells. A similar operation is performed for ECC codes. During readout, data is read in the opposite order; in the memory controller 2, the ECC codes generated for the respective data groups are compared with the ECC codes read from the spare area 9, and error detection and error correction are performed.

Figure 8:
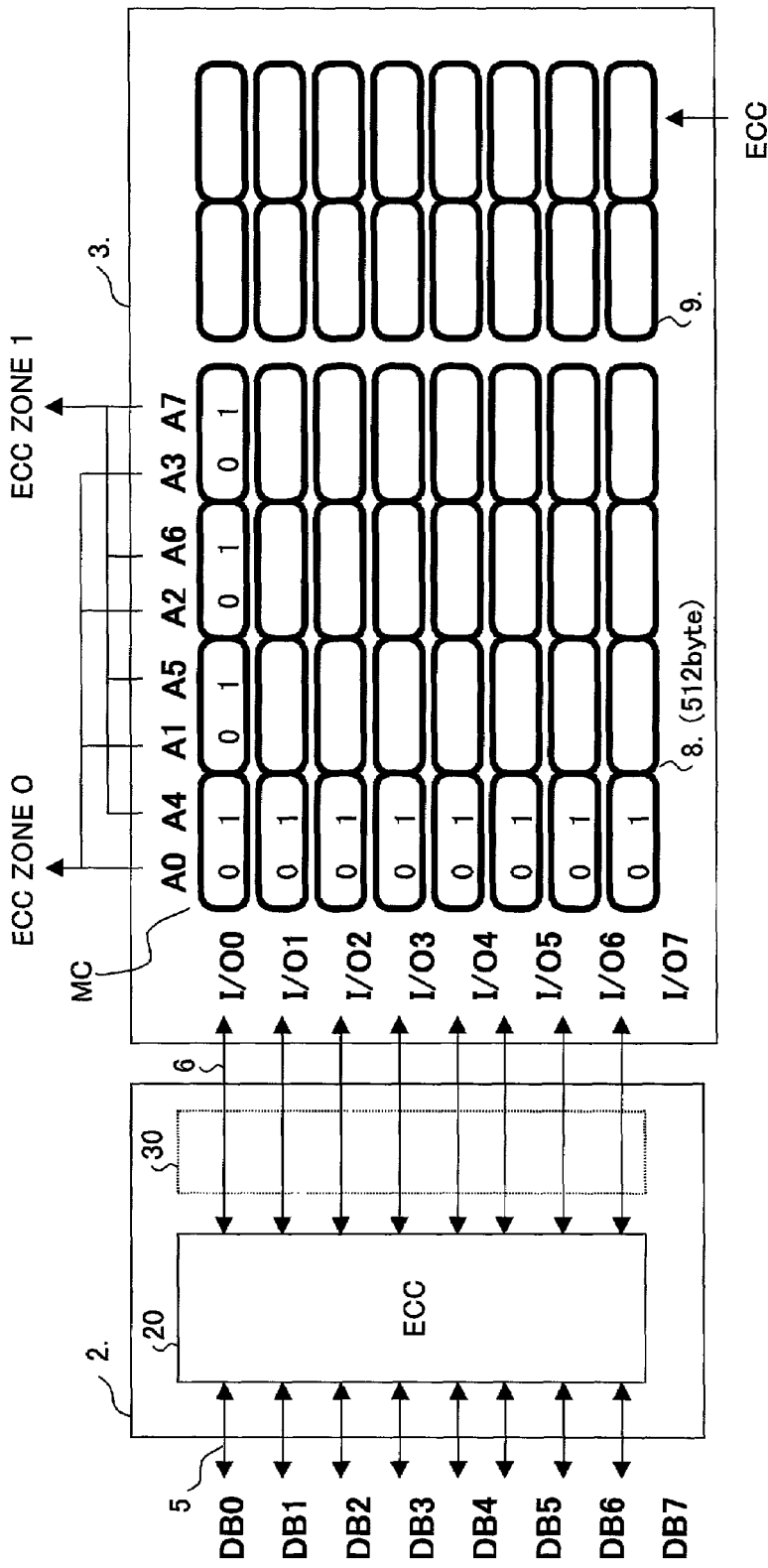
FIG. 8 is a figure showing an example of the configuration of a memory device and memory controller, for the case in which page data is separated in address (row) units into a plurality of ECC zones.

FIG. 8 is a figure showing an example of the configuration of a memory device and memory controller, for the case in which page data is separated in address (row) units into a plurality of ECC zones. As opposed to the cases of FIG. 6 and FIG. 7, in this memory device the two data bits of a two-bit cell are output to the eight input/output terminals I/O0 to 7 without overlap. That is, for a given address, one data bit each is output from eight cells to the eight input/output terminals I/O0 to 7. Hence in order to separate the two data bits associated with a single cell into a plurality of ECC zones, the data of one page must be separated in address (row) units.

In the memory device 3 of FIG. 8 (if it is assumed that the data area 8 has eight bytes of data with addresses A0 to 7), the lower addresses A0, A1, A2, A3 are allocated to the first bit of four cells, and the upper addresses A4, A5, A6, A7 are allocated to the second bit of the same four cells. Hence in this case, by separating one page of data into lower addresses A0 to 3 and upper addresses A4 to 7, and generating ECC codes for each, even ECC codes capable of correcting only single-bit errors can be used to correct the two data bit errors accompanying one defective cell.

In this case, addresses are incremented starting from the lowest address A0, and so the ECC circuit 20 of the memory controller 2 inputs the 8 bits supplied from the first data bus 5 in order, generates a first ECC code for the first data group, associated with addresses A0 to 3, and generates a second ECC code for the second data group, associated with addresses A4 to 7. After writing the data of addresses A0 to 7 to the data area 8, the first and second ECC codes are written in order to the spare area 9.

Hence the ECC circuit 20 of the memory controller 2 is provided for common use with the first and second ECC zones. However, an ECC holding circuit, not shown, is necessary in the ECC circuit 20. The data output circuit 30 in the memory controller 2 outputs the eight bits of data of the first data bus 5 without modification to the second data bus 6, supplying them to the eight bits of the input/output terminals I/O0 to 7 of the memory device 3.

Figure 9:
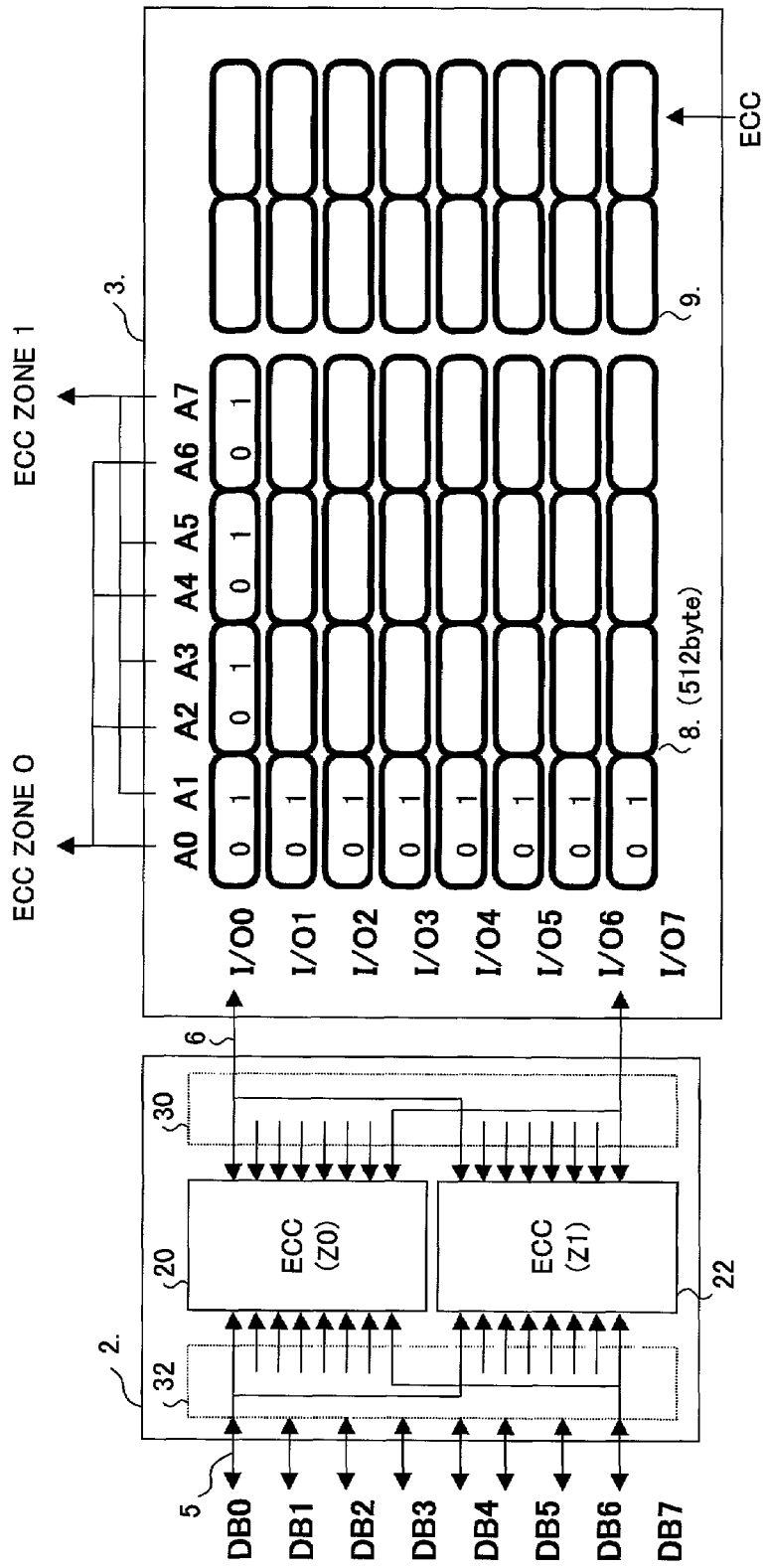
FIG. 9 is a figure showing another example of the configuration of a memory device and memory controller, for the case in which page data is separated in address (row) units into a plurality of ECC zones.

FIG. 9 is a figure showing another example of the configuration of a memory device and memory controller, for the case in which page data is separated in address (row) units into a plurality of ECC zones. In this example also, in the memory device 3, the two bits of data of one cell are output without overlap to eight input/output terminals I/O0 to 7. That is, for a given address, one data bit from each of eight cells is output to eight input/output terminals I/O0 to 7. Hence in order to separate the two data bits associated with a single cell into a plurality of ECC zones, the data of one page must be separated in address (row) units.

Specifically, in the memory device 3 (if it is assumed that the data area 8 has eight bytes of data with addresses A0 to 7), the even-numbered addresses A0, A2, A4, A6 are allocated to the first bit of four cells, and the odd-numbered addresses A1, A3, A5, A7 are allocated to the second bit of the same four cells. Hence in this case, by separating one page of data into odd-numbered and even-numbered addresses and generating ECC codes for each, even ECC codes capable of correcting only single-bit errors can be used to correct the two data bit errors accompanying one defective cell.

In the case of such a memory device, the memory controller 2 has data input means 32 to supply the eight data bits DB0 to 8 of the first data bus 5, in order, to the first and second ECC circuits, and data output means 30 to output the eight data bits via the first and second ECC circuits and the ECC codes to the second data bus 6. ECC circuits are not used in common, but are provided for each of the first and second data groups.

Figure 10:
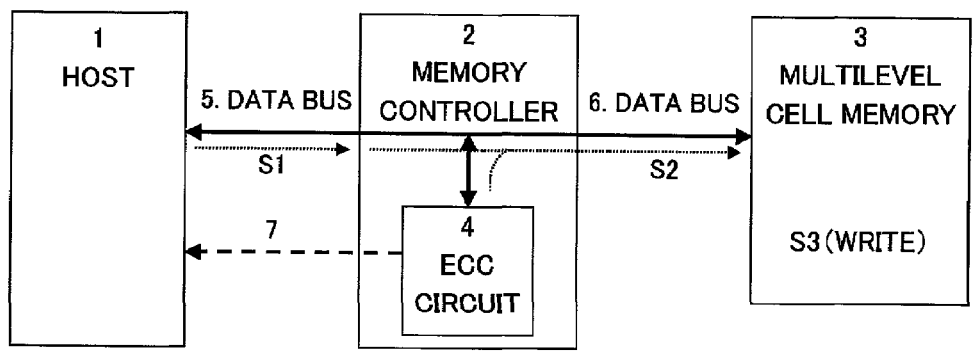
FIG. 10 is a figure which explains write operations to multilevel cell memory.

FIG. 10 is a figure which explains write operations to multilevel cell memory. Write operations are as follows. First, in order to write data to the multilevel cell memory 3, the host 1 supplies a write destination address (page address) in the multilevel cell memory 3 and data to be written to the multilevel cell memory 3 to the memory controller 2, via the first data bus 5 (step S1). Then, the memory controller 2 supplies the write destination address (page address) in the multilevel cell memory 3 and the data for writing to the multilevel cell memory 3, supplied by the host 1, to the multilevel cell memory 3, via the second data bus 6. In order that error detection and correction of this data can be performed at the time of reading of the data, the ECC circuit 4 generates an ECC code according to the data and supplies it to the multilevel cell memory 3 via the second data bus 6 (step S2). Next, the multilevel cell memory 3 writes the data supplied by the memory controller 2 to the data area 8 of the multilevel cell memory 3 at the page corresponding to the write destination address, also supplied by the memory controller 2, and then, in the redundant data area 9, writes the ECC code generated based on the data (step S3).

The above supply of data for writing and ECC data to the multilevel cell memory 3 is performed in synchronization with the system clock; the data for writing and ECC data are stored in the page buffer corresponding to the address within the multilevel cell memory 3, which is incremented in synchronization with the clock.

Figure 11:
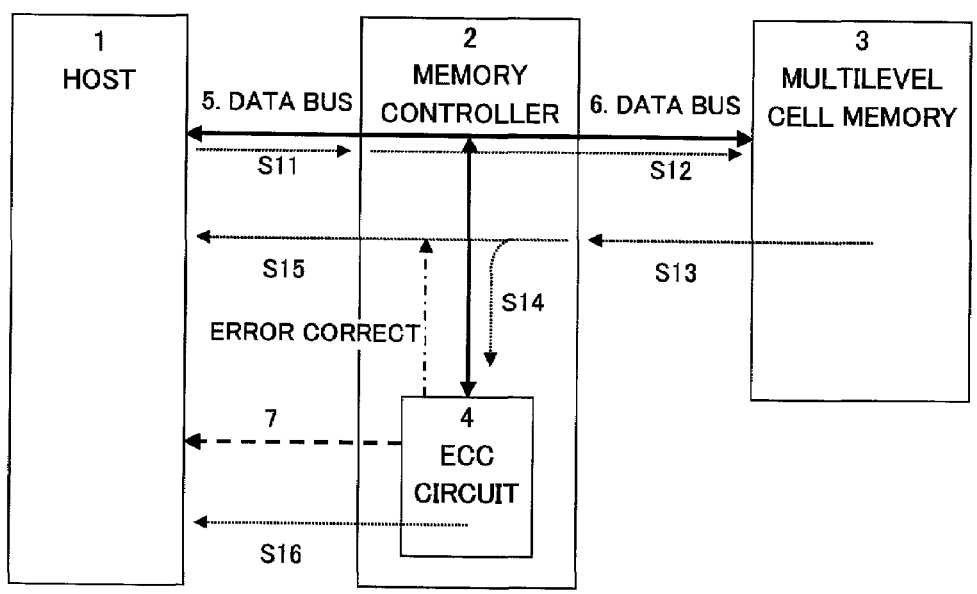
FIG. 11 is a figure which explains read operations from multilevel cell memory.

FIG. 11 is a figure which explains read operations from multilevel cell memory. The read operation is as follows. In order to read data from the multilevel cell memory 3, the host 1 supplies a read address (page address) in the multilevel cell memory 3 to the memory controller 2, via the first data bus 5 (step S11). Next, the memory controller 2 supplies to the multilevel cell memory 3, via the second data bus 6, the read address of the multilevel cell memory 3, supplied by the host 1 (step S12).

Next, the multilevel cell memory 3 reads, in order, the data in the data area 8 at the page corresponding to the read address supplied by the memory controller 2, and the ECC code from the redundant data area 9, and supplies these to the memory controller 2 via the second data bus 6 (step S13).

The memory controller 2 supplies the readout data and ECC code, supplied by the multilevel cell memory 3, to the ECC circuit 4 for the purpose of error detection and correction (step S14). The readout data is also supplied to the host 1 via the first data bus 5 (step S15).

The ECC circuit 4 performs error detection and correction of the readout data supplied by the memory controller 2, based on the ECC code, and uses the error notification means 7 to notify the host of the result (step S16). In cases where errors are detected and error correction is possible, the memory controller 2 notifies the position of the data bits to be corrected via the first data bus 5.

Or, in cases where the ECC circuit 4 has a one-page internal data buffer, one page worth of data is stored temporarily in the data buffer, and the data and ECC code are used to detect the positions of data bits to be corrected, and to perform data correction. The corrected data is then supplied to the host 1 via the first data bus 5. In this case, error notification is unnecessary.

Next, an example of division in input/output terminal (column) units, and an example of division in address (row) units, are explained in detail, including the specific ECC method.

Example of Division in Input/Output Terminal (Column) Units

Figure 12:
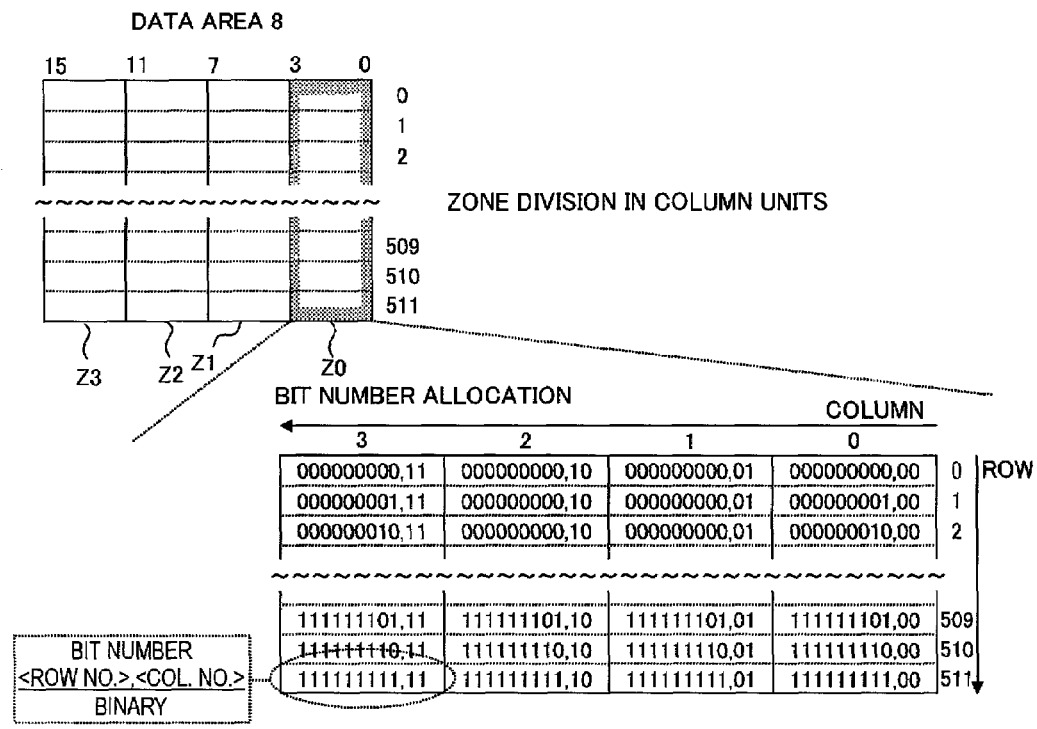
FIG. 12 is a figure showing an example of division in input/output terminal (column) units.

FIG. 12 is a figure showing an example of division in input/output terminal (column) units. In this example, as shown in the upper part of FIG. 12, the data areas 8 of each page of the multilevel cell memory 3 have a capacity of 512 words, and are divided into four zones Z0 to Z3, with columns 0 to 3, 4 to 7, 8 to 11, and 12 to 15. As shown in the middle part of FIG. 12, bit numbers are allocated respectively to the 4×512 bits of data in each zone. These bit numbers (9 bits) comprise a combination of row numbers and column numbers (2 bits), in binary notation.

The ECC codes in this example are capable of correcting one-bit errors, and, with the data divided into a pair of data groups having a "0" or "1" in each digit of the bit number, the ECC codes comprise the parity of all bits associated with each data group. That is, as shown in the lower part of FIG. 12, the pair of ECC codes lp00, lp01 has the parity lp00 (lp: line parity) of the data group in which the lowest bit of the row number of the bit number is "0", and the parity lp01 of the data group in which the lowest bit of the row number is "1". The next ECC code pair lp02, lp03 has the parity lp02 of the data group in which the second-lowest bit of the row number of the bit number is "0", and the parity lp03 of the data group in which the same bit is "1". Similarly, the ECC codes comprise pairs of parity for each digit of the bit number representing a row number.

In the same way, for the two digits of column numbers of the bit number also, there are two pairs of ECC codes cp01 to cp03 (cp: column parity) comprising the parity of data groups having "0" and "1" as the column number digits. The bit number for the data of one ECC zone comprises 11 digits, so that if ECC codes are generated from a parity pair for each digit, a total of 22 ECC code bits are generated.

In this ECC code method, the 512×4 bits of data in an ECC zone are divided into two using 11 different division methods, and the parity of all the data bits divided in each way is generated. Hence the ECC code generation circuit counts the number of "1"s or "0"s in the supplied data, and depending on whether the result is even or odd, sets the ECC code to "1" or "0". The ECC code generation circuit is realized by, for example, 22 flip-flop circuits which are inverted according to the supplied data. The supplied data is distributed to the 22 flip-flop circuits according to the bit numbers. The configuration will differ depending on whether odd parity or even parity is adopted.

Figure 13:
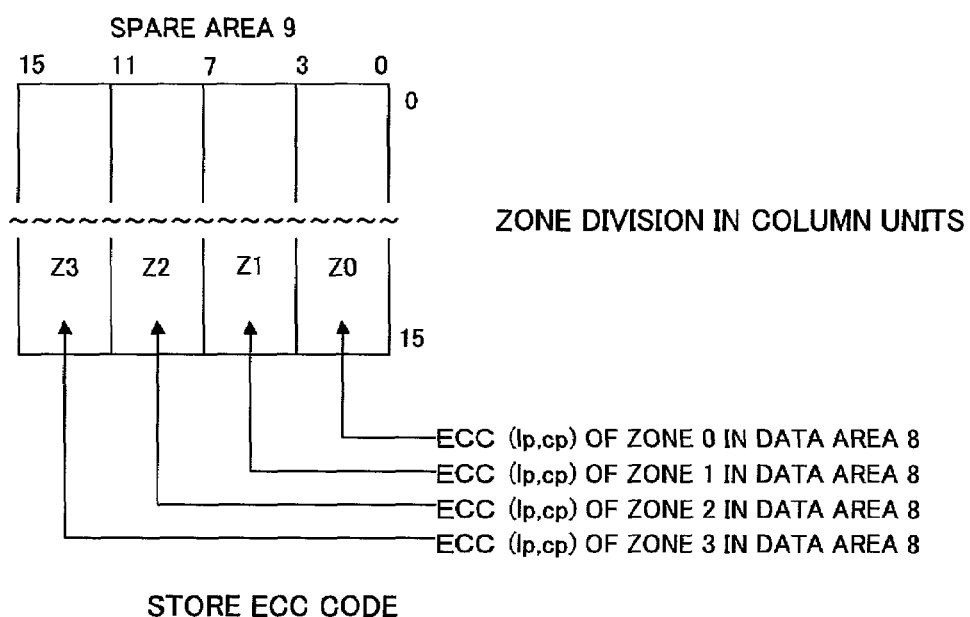
FIG. 13 is a figure which explains storage of ECC codes in spare area.

FIG. 13 is a figure which explains storage of ECC codes in spare area. The spare area of the memory device has cells which replace defective cells and cells which store ECC codes, and has a 16-word capacity. As the data in a page is divided into four in the column direction, the spare area 9 is also divided into four zones Z0 to Z3 in the column direction. The ECC codes generated corresponding to each zone are stored in each of the zones of the spare area 9.

Figure 14:
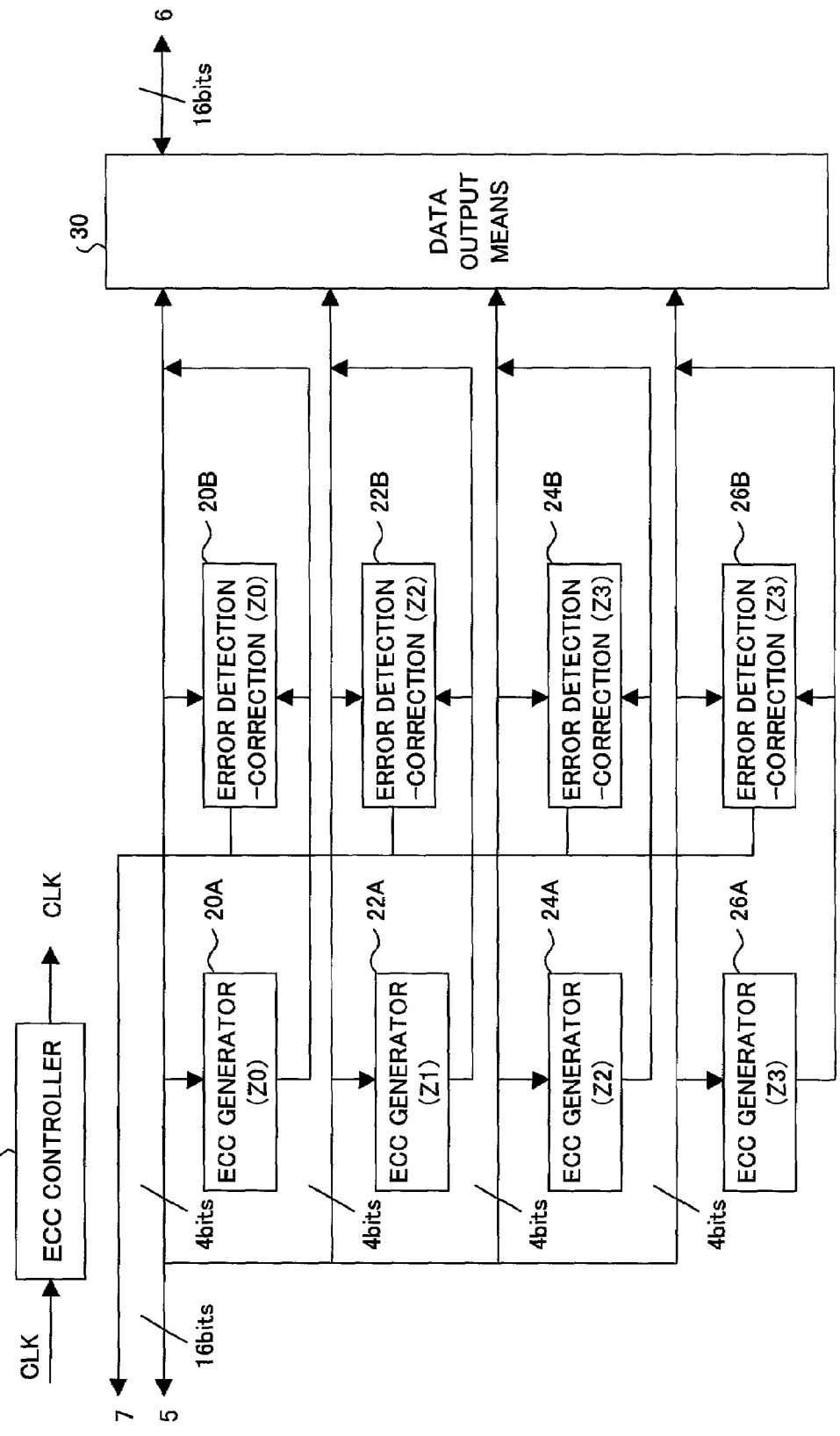
FIG. 14 is a figure showing an ECC circuit within a memory controller applied to the example of FIGS. 12 and 13.

FIG. 14 is a figure showing an ECC circuit within a memory controller applied to the example of FIGS. 12 and 13. This example is the ECC circuit corresponding to FIG. 6. In the example of FIGS. 12 and 13, as each page consists of 512 bytes of data, the first data bus 5 and second data bus 6 have a 16-bit configuration. And because the 16 bits are divided among four zones, the ECC circuit also has a four-column configuration corresponding to the four zones.

As explained in FIG. 12, each data byte supplied by the host 1 via the first data bus 5 is divided at each four bits, and supplied to the corresponding ECC code generation circuit 20A to 26A. At the same time, each data byte is supplied to the memory device through the second data bus 6, via the data output means 30. Each of the ECC code generation circuits 20A to 26A counts the data supplied, and generates the above-described parity code.

An ECC control circuit 50, provided within the memory controller, generates the internal clock CLK in synchronization with the system clock CLK; data supplied in synchronization with this clock CLK is transferred to the memory device, and the ECC code generation circuit performs a data counting operation.

At the point when 512 bytes of data have been supplied, the ECC generation circuits 20A to 26A end the generation of ECC codes for each zone. Hence in succession to the data, the ECC codes are supplied to the memory device from the data output means 30 via the second data bus 6. The ECC code generated for each zone is, like data divided into zones, output from the second data bus 6, so that as explained in FIG. 13, the ECC codes are stored in the different zones of the spare area 9 within the memory device.

At the time of a readout operation, 512 bytes of data are read from the data area 8 in the memory device, and are supplied to the memory controller from the second data bus 6. Data is transferred by the data output means 30 in the opposite direction, 16 bits of readout data are divided into four zones, and are supplied to the corresponding ECC code generation circuits 20A to 26A. Simultaneously with this, the readout data is supplied to the host 1 via the first data bus 5.

When readout of the 512 bytes of data ends, generation of the corresponding ECC codes by each of the ECC code generation circuits 20A to 26A also ends. If at most one bit error occurs in the readout data in each ECC zone, the ECC codes generated at the time of readout differ from the ECC codes stored at the time of writing. Hence the error detection and correction circuits 20B to 26B compare the ECC codes subsequently read out with the newly generated ECC codes, in order to detect differences and detect error bits.

In order to detect whether the parity matches for 11 pairs, each error detection and correction circuit has 22 exclusive OR logic circuits. Comparison of the ECC codes read from the spare area of the memory device and the ECC codes newly generated at the time of readout, that is, comparison of the parity of 11 pairs, is then performed. In the ECC code method of this example using parity pairs, error detection is performed as explained below using the result of an exclusive OR operation.

In the first case, if the ECC codes lp00 to lp17 and cp00 to cp03 are all in agreement, and the result of the exclusive OR operation is "0", the data is normal and no error correction is necessary. In the second case, if for all pairs of the ECC codes lp00 to lp17 and cp00 to cp03, the result of one pair is "0" and the result of the other pair is "1" (not coincident), a one-bit error has occurred, and this error can be corrected. In the third case, if, of the ECC codes lp00 to lp17 and cp00 to cp03, only one result is "1" (not coincident), this means that the data is normal, but that an error has occurred in the stored ECC codes, and data error correction is not necessary. In the fourth case, that of an exclusive OR result other than the above, an uncorrectable error has occurred.

In the above second case, the data error bit can be determined from the 11 data groups in which non-coincidence has occurred. In the case of even parity, the bit number for correction is, of the 22 exclusive OR results, the exclusive OR data of the odd-numbered ECC codes lp17, lp15, lp13, lp11, lp09, lp07, lp05, lp03, lp01, cp03, cp01. In the case of even parity, the bit number for correction is the exclusive OR data of the even-numbered ECC codes.

Hence the error detection and correction circuit notifies the host 1 of the result of an exclusive OR operation of the readout ECC codes and the ECC codes generated from the readout data, as the bit number of the data for which an error has occurred.

N-bit error correction using the above error correction code assumes high reliability of the memory device, and correction of errors in cases in which there are errors in at most a single N-level cell. If errors occur in a plurality of N-level cells, correction is not possible.

Example of Division in Address (Row) Units

Figure 15:
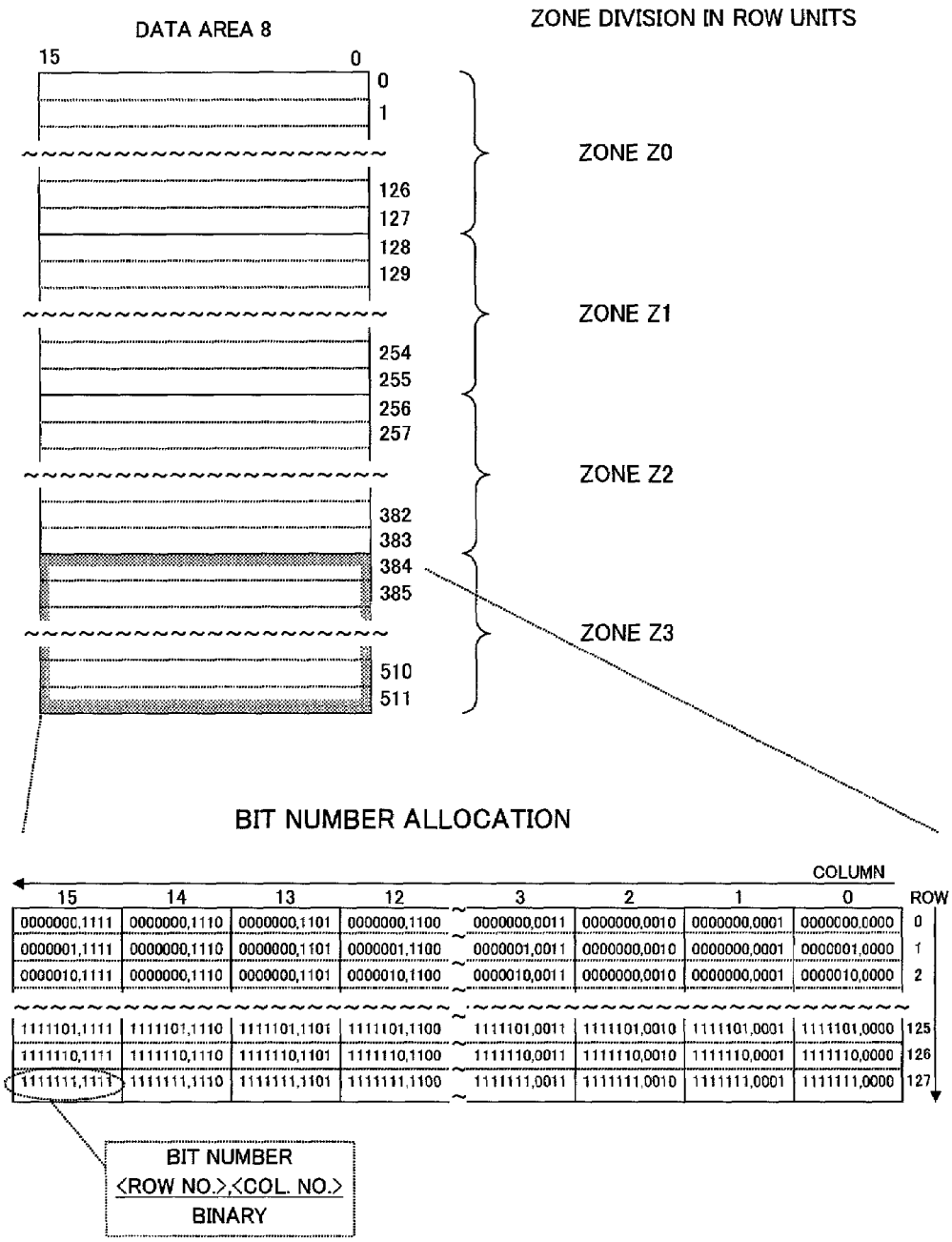
FIG. 15 is a figure showing an example of division in address (row) units.

FIG. 15 is a figure showing an example of division in address (row) units. In this example, as shown in the top part of FIG. 15, the data area 8 of each page of the multilevel cell memory has a capacity of 512 words, divided into four zones Z0 to Z3, with addresses 0 to 127, 128 to 255, 256 to 383, and 384 to 511. As shown in the bottom part of FIG. 15, bit numbers are allocated to the 16×128 bits of data in each zone. These bit numbers comprise combinations of row numbers (7 bits) and column numbers (4 bits), in binary notation.

In the bottom part of FIG. 15, bit numbers are allocated for the data of zone Z3. That is, the row numbers are 0 to 127 and column numbers are 0 to 15, and each bit number is represented by 11 bits.

FIG. 16 is a figure showing an example of ECC codes generated for each zone. The ECC codes of this example also employ a method such that single-bit error can be corrected within a zone even with a small number of bits for ECC; in FIG. 15, the data in a zone is divided into "0" data groups and "1" data groups for each digit of the bit numbers assigned to the data. Hence as shown in FIG. 16, one pair of ECC codes lp00, lp00 comprises a parity bit for the data group the lowest bit of the row number of which is "0", and a parity bit for the data group the same bit of which is "1". Other ECC codes are similar, and in total there are 11 pairs of parity bits.

Figure 17:
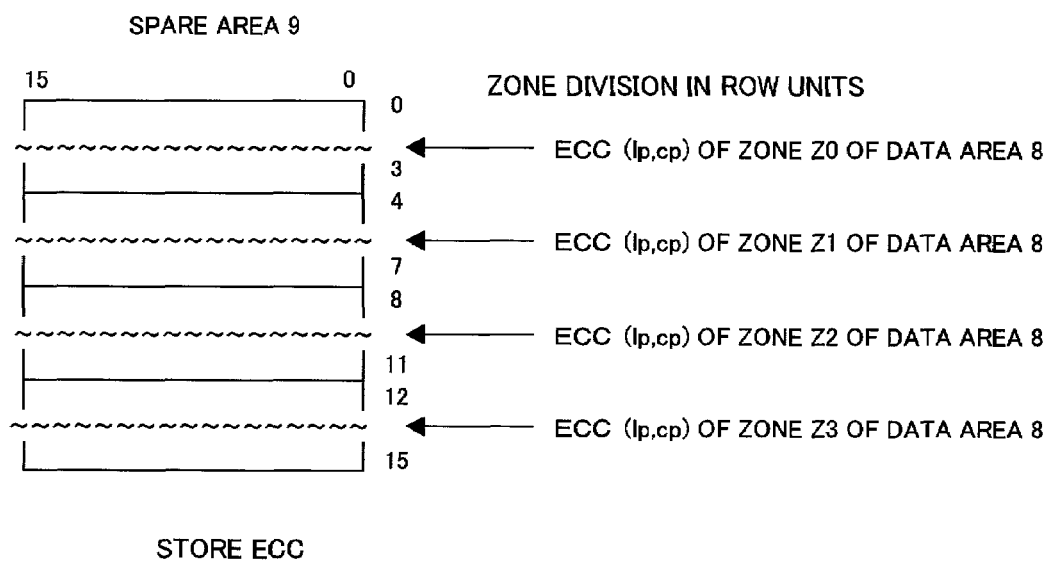
FIG. 17 is a figure which explains storage of generated ECC codes into storage area; and, FIG. 18 is a figure showing an ECC circuit within a memory controller applied to the example of FIGS. 15 through 17.

FIG. 17 is a figure which explains storage of generated ECC codes into the spare area. The 16-word spare area 9 allocated to each page of the N-level cell memory is divided in four by address (row), and the ECC codes of zone Z0 are stored in the spare area of addresses 0 to 3, the ECC codes of zone Z1 are stored in the spare area of addresses 4 to 7, the ECC codes of zone Z2 are stored in the spare area of addresses 8 to 11, and the ECC codes of zone Z3 are stored in the spare area of addresses 12 to 15.

Figure 18:
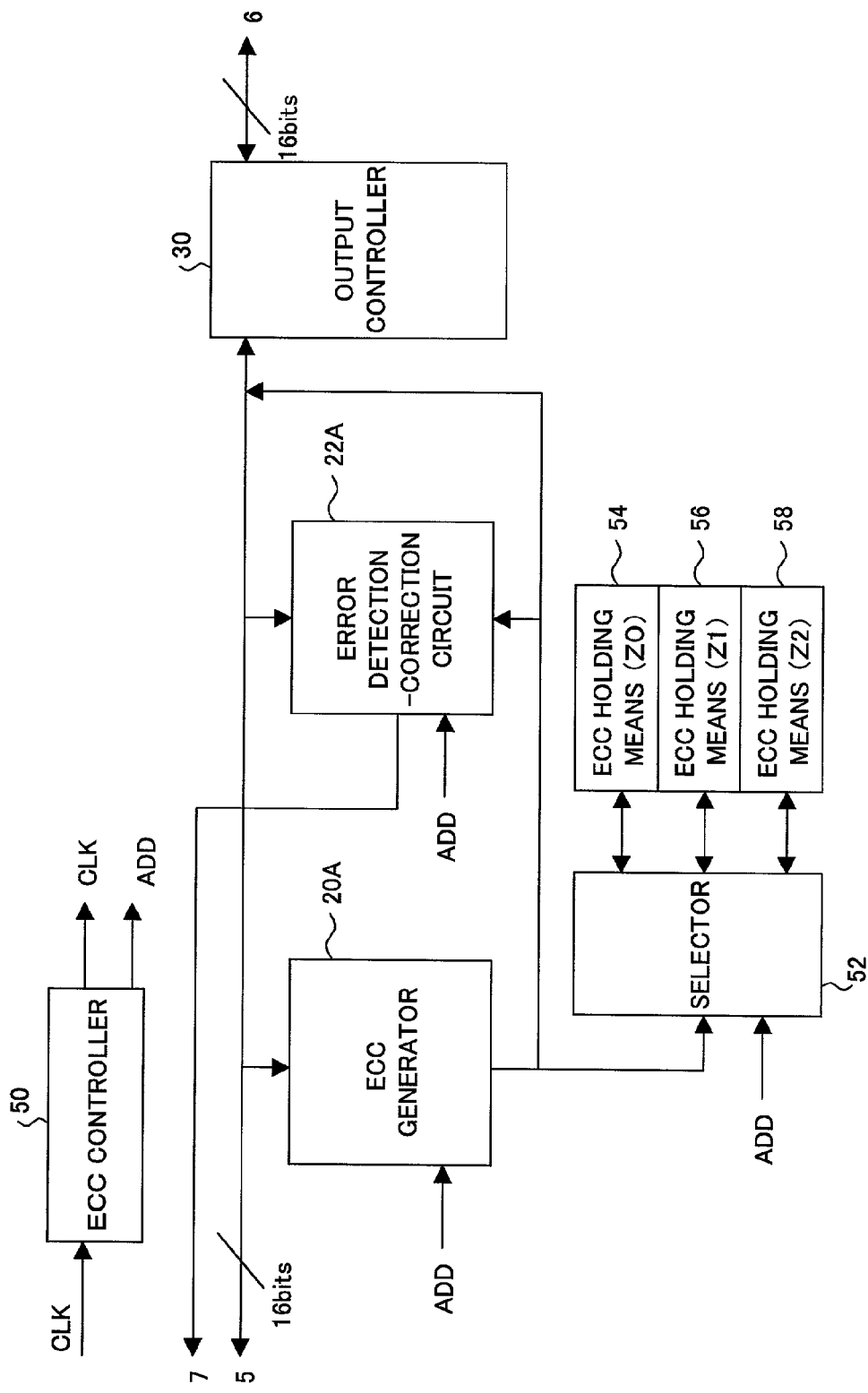

FIG. 18 is a figure showing an ECC circuit within a memory controller applied to the example of FIGS. 15 through 17. This example corresponds to the memory controller shown in FIG. 8. As opposed to the ECC circuit of FIG. 14, for the case of division in the input/output terminal (column) direction, in FIG. 18 only one ECC circuit, comprising an ECC code generation circuit 20A and error detection and correction circuit 22A, is provided. ECC code holding means 54, 56, 58 to hold the ECC codes for the three ECC zones, and a selector circuit 52, are also provided.

In the above example, the 512 words of data in the page is separated into four zones, with the lower addresses 0 to 127, and the upper addresses 128 to 255, 256 to 382, and 383 to 511. When a page address for writing is supplied from the host 1, the memory device increments the internal address ADD in the page in synchronization with the system clock CLK. Hence the 16-bit data of the lower addresses 0 to 127 is first output, in order, to the first data bus 5 from the host 1, and is transferred to the memory device from the output control circuit 30 via the second data bus 6; in addition, the lower-address data is supplied, in order, to the ECC code generation circuit 20A.

The ECC code generation circuit 20A consists of, for example, 22 flip-flop circuits for II pairs of ECC, and data is distributed to the flip-flop circuits according to the address ADD. Hence at the time when transfer from the host 1 to the memory device 3 of the 512 words of data associated with the lower addresses 0 to 127 is ended, ECC code generation for this zone Z0 is also ended, and the ECC codes are stored temporarily in the ECC code holding means 54, via the selector 52.

The data of the subsequent addresses 128 to 255 is similarly transferred, in order, from the host 1 to the memory device 3 in word units, and is also supplied to the ECC code generation circuit 20A, to generate ECC codes for the zone Z1. After generation, the ECC codes are stored temporarily in the ECC code holding means 56. The data of zones Z2 and Z3 is similarly transferred to the memory device 3 via the second data bus 6, and the respective ECC codes are generated.

When transfer of all data to the memory device 3 is ended, the ECC codes of the zones Z0, Z1, and Z2 are stored in the holding means 54, 56, 58 respectively, and the ECC code generation circuit 20A ends generation of the ECC codes for zone Z3. Then, in succession to the data, the ECC codes for the four zones are stored in the addresses 0 to 3, 4 to 7, 8 to 11, and 12 to 15, respectively in the spare area.

Next, at the time of readout from the memory device, the data of the page specified by the host 1 is read, in order, according to the internal address ADD incremented in synchronization with the system clock CLK, and is supplied to the ECC code generation circuit 20A, and is also transferred to the host 1. As the address is incremented, the ECC codes for the zones Z0, Z1, Z2 are generated in order, and are stored in the ECC code holding means 54, 56, 58, respectively. After the ECC codes for zone Z3 are generated by the generation circuit 20A, the ECC codes which had previously been generated and stored are read, in order, from the spare area of the memory device, and are supplied to the error detection and correction circuit 22A.

The error detection and correction circuit 22A has 22 exclusive OR circuits corresponding to 11 pairs of ECC codes, and performs checks to determine whether there is coincidence between the ECC codes generated at the time of reading of each zone, and the ECC codes read from the spare area of the memory device.

The ECC codes of this example are the same as in the previously described example, and the error detection method, and method of address generation of the bit for correction on occurrence of a one-bit error, are also the same. The error detection and correction circuit 22A performs comparisons of ECC codes, in the order zone Z0, Z1, Z2, Z3, according to incrementing of the address.

In the above example, 512 bytes of data are separated into four ECC zones, and the error correction codes for each are generated and are stored in memory. However, if a single N-level cell of N-level cell memory stores two bits of data, the data may be separated into only two ECC zones. That is, the data need only be separated into N or greater zones, and ECC codes generated for each zone.

Thus by means of the present invention, a memory controller can be provided which generates ECC codes enabling error correction of the data of a multilevel cell memory, and which performs error detection and correction.

Also, in this invention, the data of a multilevel cell memory is separated, so that there is no overlap of the n bits of data associated with one multilevel cell, into first through Mth data groups (where M is greater than or equal to n), and first through Mth error correction codes are generated for these first through Mth data groups; hence even if a defect occurs in one multilevel cell, so that errors occur in n bits, correction of one bit each can be performed using the error correction codes for each data group, so that correction of n error bits is possible.

What is claimed is:

1. A memory controller for a multilevel cell memory, connected between a host and an N-level (N=2$^n$, where n is an integer greater than or equal to 2) cell memory via a data bus the width of which is a plurality of bits, and the memory controller comprising:

first through Mth FCC circuits, into which first through Mth (where M is greater than or equal to n) data bus groups of a first data bus connected to said host are input in parallel respectively, and which, for first through Mth data groups being input via the first through Mth data bus groups respectively, generate first through Mth error correction codes for correcting a single-bit defect, a page of data being comprised of the first through Mth data groups;

a data output unit, which outputs the first through Mth data groups to a second data bus connected to data input/output terminals of said N-level cell memory such that n data bits associated with a single N-level cell are separated into the first through Mth data groups, without overlap, such that each of the first through Mth data groups include no more than a single one of the n data bits, wherein said data output unit further outputs to said second data bus the respective error correction codes generated by the ECC circuits.

2. The memory controller for a multilevel cell memory according to claim 1, wherein the data input/output terminals of said N-level cell memory are divided, in order from the lowest, into first, second, . . . , Mth data groups, and said data output unit outputs data to the second data bus to be allocated, in order from the lowest, to the first, second, . . . , Mth data groups.

3. The memory controller for a multilevel cell memory according to claim 2, wherein the data of said first data bus is divided, in order from the lowest, into first, second, . . . , Mth data groups, and input to first through Mth ECC circuits.

4. The memory controller for a multilevel cell memory according to claim 1, wherein the data input/output terminals of said N-level cell memory are divided, in order from the lowest, into data groups associated with N-level cells, and said data output unit outputs data to the second data bus such that the data of the first, second, . . . , Mth data groups are cyclically repeated, in order from the lowest.

5. The memory controller for a multilevel cell memory according to claim 1, wherein, when reading data from said N-level cell memory, said first through Mth ECC circuits input the first through Mth data groups and first through Mth error correction codes transferred via second data bus, and the first through Mth ECC circuits perform one-bit error correction within the first through Mth data groups.

6. The memory controller for a multilevel cell memory according to claim 5, wherein writing of data and ECC codes to said N-level cell memory is performed along a route, between said host and said N-level cell memory, from the first data bus to the first through Mth ECC circuits, data output unit, and second data bus; and data reading is performed along an opposite direction of the route.

7. The memory controller for a multilevel cell memory according to claim 1, wherein, upon writing to said N-level cell memory in synchronization with a clock, data is supplied from said first data bus, said data output unit outputs the data to said second data bus, and said ECC circuits generate error correction codes for the first through Mth data groups; and, after output of one page of data to said second data bus, said data output unit outputs error correction codes to said second data bus, in synchronization with the clock.

8. The memory controller for a multilevel cell memory according to claim 1, wherein, upon reading from said N-level cell memory, in synchronization with a clock, data is supplied from said second data bus, and said ECC circuits generate error correction codes for the first through Mth data groups; and, after supply of one page worth of data, error correction codes are supplied from said second data bus, and said ECC circuits compare said generated error correction codes and the supplied error correction codes, and perform error detection and correction, in synchronization with the clock.

9. The memory controller for a multilevel cell memory according to claim 1, wherein said error correction codes have parity bits for a first group and for a second group respectively, "0" for the first group and "1" is for the second group.

10. The memory controller for a multilevel cell memory according to claim 9, wherein, during error detection and correction, if one of the pair of parity bits is coincident and the other is not coincident in all bit number digits, said FCC circuits detect the occurrence of a one-bit error.

11. The memory controller for a multilevel cell memory according to claim 10, wherein, during error detection and correction, said ECC circuits perform exclusive OR operations of supplied error correction codes, supplied from said memory, and error correction codes generated for data supplied from said memory, and, if one of the pair of parity bits is coincident and the other is not coincident in all bit number digits, the exclusive OR operation value of said odd-numbered bit number or even-numbered bit number is taken to be the bit number of error occurrence.

12. A memory controller for a multilevel cell memory, connected between a host and an N-level ($N=2^n$, where n is an integer grater than or equal to 2) cell memory, via data buses each with a plurality of bits, comprising:
 a common ECC circuit, which receives, in order, first through Mth (where M is greater than or equal to n) data groups, separated in an address direction, for the data groups of a first data bus connected to said host, and generates first through Mth error correction codes for correcting a single-bit defect for the respective first through Mth data groups, a gage of data being comprised of the first through Mth data groups;
 an error correction code holding unit, which holds said first through (M−1)th error correction codes; and,
 a data output unit, which outputs the first through Mth data groups to a second data bus connected to said N-level cell memory, such that n-data bits associated with one N-level cell are separated into first through Mth data groups, without overlap, such that each of the first through h Mth data groups include no more than a single one of the n data bits, wherein
 said data output unit outputs to said second data bus the first through (M−1)th error correction codes held by said error correction code holding unit, and the Mth error correction code generated by said ECC circuit.

13. The memory controller for a multilevel cell memory according to claim 12, wherein, upon writing to said N-level cell memory, in synchronization with a clock, data is supplied from said first data bus, said data output unit outputs the data to said second data bus, and said ECC circuit generates error correction codes in sequence for the first through Mth data groups; and, after output of one page worth of data to said second data bus, said data output unit outputs said effort correction codes to said second data bus, in synchronization with the clock.

14. The memory controller for a multilevel cell memory according to claim 12, wherein, upon reading from said N-level cell memory, in synchronization with a clock, data is supplied from said second data bus, and said ECC circuit generates error correction codes in sequence for the first through Mth data groups; and, after supply of one page of data, error correction codes are supplied from said second data bus, and said ECC circuit compares said generated error correction codes and the supplied error correction codes, and perform error detection and correction, in synchronization with the clock.

15. The memory controller for a multilevel cell memory according to claim 12, wherein said error correction codes have parity bits for a first group and for a second group respectively, where each digit of the bit number assigned to each data group is "0" for the first group and "1" for the second group.

16. A memory controller for a multilevel cell memory, connected between a host and an N-level ($N=2^n$, where n is an integer greater than or equal to 2) cell memory, via data buses each with a plurality of bits, comprising:
 first through Mth ECC circuits, which receive first through Mth (where M is greater than or equal to n) data groups, separated in an address direction, for the data groups of a first data bus connected to said host, and generate first through Mth error correction codes for correcting a single-bit defect for the respective first through Mth data groups, a page of data being comprised of the first through Mth data groups; and,
 a data output unit, which outputs the first through Mth data groups to a second data bus connected to said N-level cell memory, such that n data bits associated with one N-level cell are separated into first through Mth data groups, without overlap, such that each of the first through Mth data groups include no more than a single one of the n data bits, wherein
 said data output unit further outputs to said second data bus the respective error correction codes generated by said first through Mth ECC circuits.

17. The memory controller for a multilevel cell memory according to claim 16, wherein, upon writing to said N-level cell memory, in synchronization with a clock, data is supplied from said first data bus, said data output unit outputs the data to said second data bus, and said ECC circuits generate error correction codes for the first through Mth data groups; and, after output of one page worth of data to said second data bus, said data output unit outputs said error correction codes to said second data bus, in synchronization with the clock.

18. The memory controller for a multilevel cell memory according to claim 16, wherein, upon reading from said N-level cell memory, in synchronization with a clock, data is supplied from said second data bus, and said ECC circuits generate error correction codes for the first through Mth data groups; and, after supply of one page worth of data, error correction codes are supplied from said second data bus, and said ECC circuits compare said generated error correction codes and the supplied error correction codes, and perform error detection and correction, in synchronization with the clock.

19. The memory controller for a multilevel cell memory according to claim 16, wherein said error correction codes have parity bits for a first group and for a second group respectively, where each digit of the bit number assigned to each data group is "0" for the first group and "1" for the second group.

* * * * *